United States Patent [19]

Taylor et al.

[11] 4,390,505
[45] Jun. 28, 1983

[54] CRYSTAL GROWTH APPARATUS

[75] Inventors: Aaron S. Taylor, Acton; Vernon E. White, Needham, both of Mass.

[73] Assignee: Mobil Solar Energy Corporation, Waltham, Mass.

[21] Appl. No.: 248,838

[22] Filed: Mar. 30, 1981

[51] Int. Cl.³ .............................................. C30B 15/34
[52] U.S. Cl. ............................ 422/246; 156/DIG. 73
[58] Field of Search .......... 156/608, 617 SP, DIG. 88, 156/DIG. 73; 422/246, 249

[56] References Cited

U.S. PATENT DOCUMENTS

| | | | |
|---|---|---|---|
| 3,291,571 | 12/1966 | Dohmen et al. | 156/608 |
| 3,977,934 | 8/1976 | Lesk | 156/608 |
| 4,116,641 | 9/1978 | Ciszek | 156/608 |
| 4,248,645 | 2/1981 | Jewett | 156/608 |
| 4,271,129 | 6/1981 | Berkman et al. | 422/246 |

FOREIGN PATENT DOCUMENTS 1316707 12/1962 France .......................... 156/617 SP

OTHER PUBLICATIONS

Kuroda et al., "Evaluation of Temp. Dist. of Melt", published in Japanese Journal of Applied Phys., vol. 18, Mar. 1979, pp. 471–477.

Primary Examiner—Hiram H. Bernstein
Attorney, Agent, or Firm—Schiller & Pandiscio

[57] ABSTRACT

A novel apparatus is disclosed for controlling the temperature of the top surface of the capillary die and the adjacent meniscus during growth of a crystalline body. The apparatus includes a tiltable heat shield located so that by appropriately positioning it about its tilt axis it is possible to adjust the temperature distribution about the top end of the capillary die. This temperature control assists in ensuring that a crystalline body grown by means of the capillary die process will have a substantially constant cross-sectional size.

12 Claims, 5 Drawing Figures

CRYSTAL GROWTH APPARATUS

This invention pertains to the apparatus and the technique used for growing crystalline material and more particularly to an improved apparatus for growing crystalline ribbon having a predetermined cross-section.

PRIOR ART

A number of different and complicated apparatus and processes are known for controlling the growth rate and shape of crystalline bodies grown from a melt. For example, one such technique is described in U.S. Pat. No. 4,118,197 in which crystalline ribbon is grown according to the edge-defined film-fed growth technique (the so-called EFG Process). With this technique the cross-sectional shape of the grown body is determined by the shape of the top surface of a capillary die. In the usual EFG mode of operation, the source material, i.e., the material from which the crystalline body is to be grown, is located at the base of the capillary die in molten form. By means of capillary action the melt is drawn up in the capillary of the die to its top surface. Then a seed crystal is brought into contact with upper end of the die and held there long enough for some of it to melt and connect with the melt in the capillary. The molten material extends across the top surface of the die and a meniscus is formed between the seed and the outer edge of the die. The crystalline material is then grown by pulling the seed upward and replenishing the molten material in the meniscus via the capillary die. In order to anneal out thermally induced stresses, the grown material may be passed through afterheaters which induce a suitable temperature gradient lengthwise of the crystalline body. The growing crystalline body grows to the shape of the meniscus which in turn conforms to the edge configuration of the end surface of the capillary die. As is well known, the cross-sectional size of the grown body depends upon the height of the meniscus which in turn depends upon the pulling speed and the temperature of the top surface of the capillary die and the adjacent meniscus. By way of example but not limitation, flat silicon ribbons measuring about 0.0015 inch thick by 2-4 inches wide may be grown from a die having a rectangular edge configuration at its top end.

For convenience, in the following description the temperature of the top surface of the capillary die and the adjacent meniscus shall be called the transition temperature. This transition temperature is somewhat greater than the temperature at which the source material melts.

In the usual case it is desirable to control the operating parameters so that the grown body has a constant crosssectional size and shape. Since it is relatively easy to maintain a constant pulling speed, the normal method followed during crystal growth is to fix the pulling speed and attempt to control the transition temperature in such a manner as to obtain the desired crystalline growth. It should be noted that for a fixed pulling speed and capillary die configuration the transition temperature will influence the cross-sectional size of the growing body, e.g., the thickness and width of a ribbon, and may affect the impurity concentration in the grown material. In the case where the grown material is in the shape of a ribbon, variations in the transition temperature along the upper end of the capillary die may result in large temperature gradients across in the ribbon transversely of the growth axis, and such gradients may cause various problems such as an interruption in crystal growth or stresses in the grown material large enough to result in cracking of the product. For these and other reasons it is desireable to provide a means for controlling the transition temperature distribution along the full expanse of the upper end surface of the die and the meniscus.

OBJECTS AND SUMMARY OF THE INVENTION

Accordingly, the primary object of this invention is to provide apparatus for controlling in a simple manner the transition temperature distribution so that the grown body has the desired properties including the predetermined cross-sectional size.

Yet another object of this invention is to provide apparatus for controlling the height of the liquid meniscus by controlling the transition temperature.

A further object is to provide an improved means and method of modifying the transition temperature distribution during growth of a ribbon-like crystalline body.

The foregoing and other objects of the present invention are achieved by employing moveable mechanical means for controlling in a precise and reproducible manner the transition temperature distribution along the top surface of the capillary die and the adjacent meniscus during the growth of a crystalline body while using the EFG process. The control of the transition temperature is achieved by using a heat shield which can be pivoted about an axis perpendicular to the direction of growth. In addition, stabilization of the transition temperature will be aided if the heat shield is fabricated from material having a fixed emissivity, e.g., graphite in the case where silicon is being grown. This property will ensure that the heat loss due to radiation arrives at a steady state value.

Other features and specific details of this invention are described in the following description which is to be considered together with the drawings wherein.

Like numerals are used to indicate like parts in the several figures.

As already noted, the capillary die process for growing crystalline bodies is characterized by a meniscus extending between the solid/liquid/vapor interface and the edge of the shape forming die. It has been established that the height of the meniscus is dependent upon the transition temperature and the pulling speed and the meniscus height should be kept substantially constant in order to grow a body of substantially constant cross-sectional size. The usual procedure for growing crystalline ribbon has been to use a constant pulling speed and to adjust the transition temperature as required in order to maintain the meniscus height at a desired value. Additionally and expecially when growing silicon ribbon, it is common to employ radiation shields and also, in the case where resistance heaters are used, a multiplicity of face and end heaters for maintaining the proper transition temperature distribution along the top end surface of the die and the meniscus. However, even with these techniques it is difficult to achieve and maintain a constant transition temperature along the full width of a silicon ribbon with the result that the temperature and hence the height of the meniscus may not be the same at ends of the meniscus corresponding to the narrow side edges of the ribbon product. This difference may cause the cross-sectional size as well as properties of the growing crystalline ribbon to change.

According to the present invention the transition temperature distribution is controlled by means of a tiltable heat shield (THS) mounted in close proximity to the top of the die. This heat shield provides a thermal environment, in terms of radiation and convection, which affects the temperature distribution along the top surface of the capillary die and the adjacent meniscus. The heat shield can be tilted about an axis perpendicular to the direction of growth and parallel to the cross-sectional dimensions in a precise manner, and by so doing it is possible to modify existing thermal gradients in a direction at a right angle to the tilt axis and also the direction of growth, whereby to maintain the transition temperature distribution required for growing a crystalline body of substantially constant cross-sectional size. While the invention is described and illustrated herein as used in the production of silicon ribbon using a furnace with an RF heater, it may be adapted for use in growing other crystalline bodies of other shapes or materials, e.g., sapphire plate, and also may be used in furnaces using one or more electrical resistance heaters.

Figure 1:
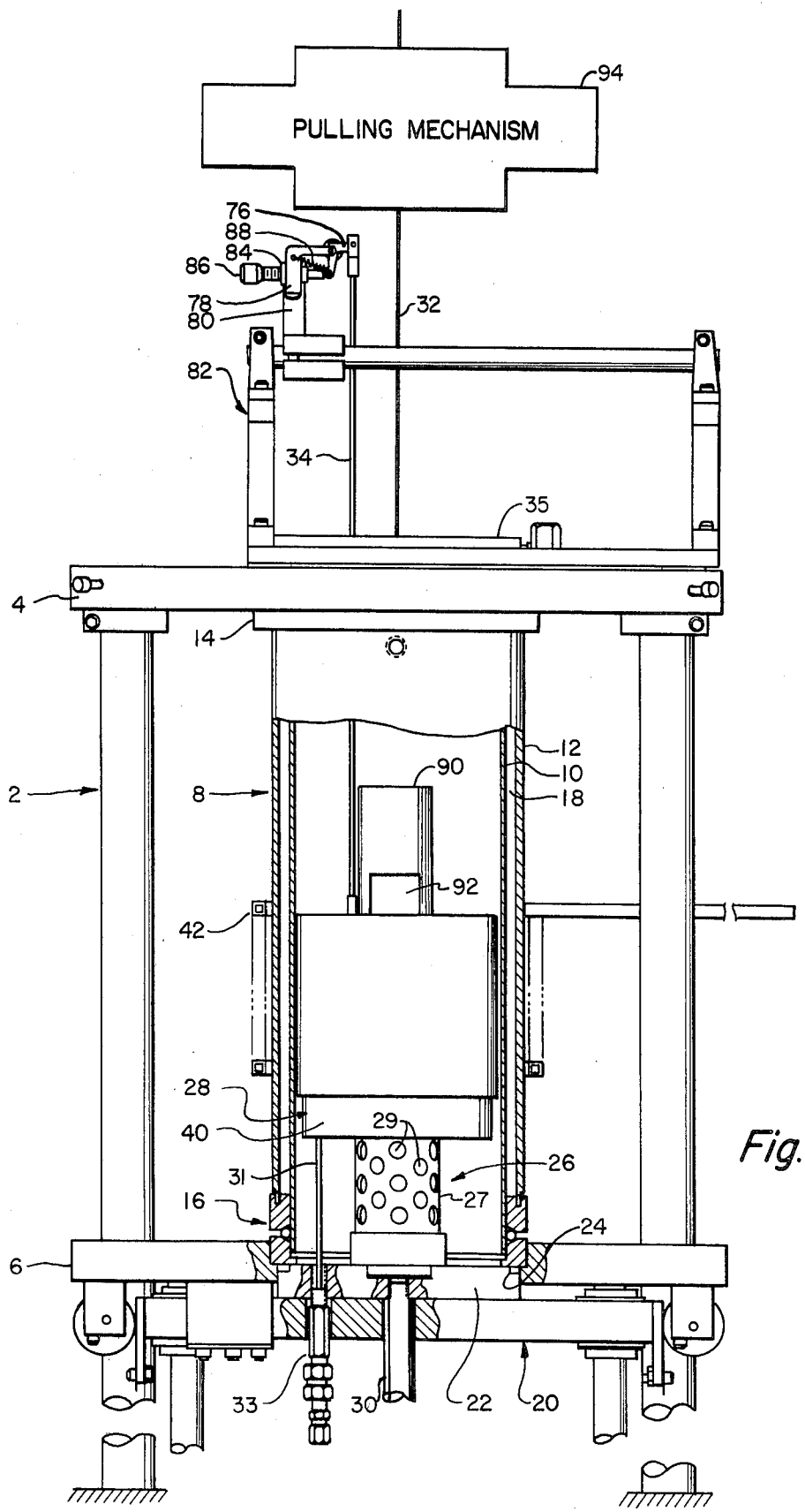
FIG. 1 is a side view in elevation, with certain parts shown in section, of a crystal growing furnace embodying a tiltable heat shield in accordance with the present invention.

Turning now to the drawings, FIG. 1 shows a crystal growing furnace which embodies a preferred form of the invention as applied to the growth of silicon ribbon. The furnace comprises a frame 2 terminating in a header 4 and a base 6, and a furnace enclosure 8 comprising inner and outer walls 10 and 12 terminating in annular top and bottom support assemblies 14 and 16 attached to header 4 and base 6 respectively. Means (not shown) are provided for circulating cooling water through the chamber 18 formed between walls 10 and 12. A platform 20 is arranged for vertical movement toward and away from the underside of base 6. Platform 20 carries a support plate 22 fitted with an annular seal 24 disposed so as to engage and make a tight hermetic seal with the bottom support assembly 16. Affixed to support plate 22 is a pedestal 26 which supports a crystal growing assembly 28 hereinafter described. Pedestal 26 comprises a hollow tube 27 with perforations 29. An inert gas is introduced to the enclosure 8 via a conduit 30 which is carried by support plate 22 and communicates with hollow tube 27. A thermocouple assembly 31 is attached to crystal growing assembly 28 for monitoring the temperature of the crucible 38 hereinafter described. Thermocouple assembly 31 is mounted to platform 20 by a tubular assembly 33 through which the thermocouple leads (not shown) are brought out to a suitable temperature indicator means (also not shown). Platform 20 is mounted in the raised position shown in FIG. 1 during crystal growth, but is adapted to be moved down far enough to remove the crystal growth assembly 28 from enclosure 8, so as to facilitate repair or replacement of assembly 28 or any of its parts and also to permit replenishment of the source material in the crucible.

The top support assembly 14 for enclosure 8 is closed off by a plate 35. Although not shown, it is to be understood that plate 35 has two openings, one shaped like but made large enough to slidably accommodate a seed and the crystalline body 32 which is grown on the seed, and the other shaped and sized to slidably accommodate a control rod 34 which forms part of the tilt shield mechanism hereinafter described. The openings in plate 35 provide limited clearances for the crystalline body 32 and rod 34 in order to maintain the inert gas in enclosure 8 at a pressure sufficient to prevent leakage of outside air into the enclosure via its top end.

Figure 2:
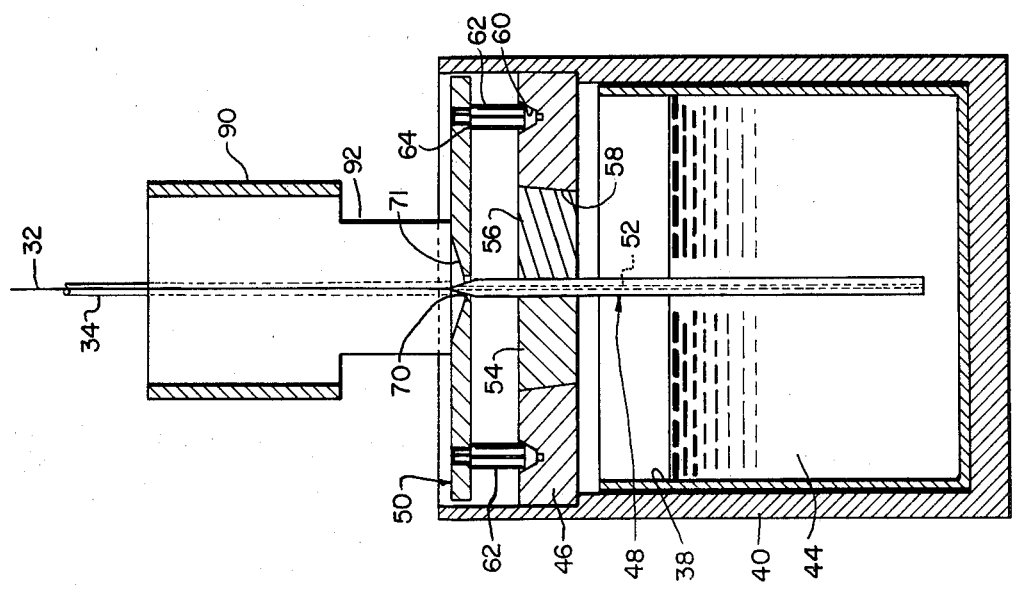
FIG. 2 is an enlarged sectional view of a portion of the same apparatus taken at a right angle of FIG. 1.

Referring now to FIG. 2, the crystal growing assembly 28 comprises a crucible 38 contained in a susceptor 40. The latter is used as an aid in transmitting heat from a high frequency electrical heater 42 which surrounds furnace enclosure 8 to the source or feed material 44 contained in the crucible. Supported on a shoulder provided by the susceptor is an annular ring 46 which serves to support a capillary die 48 and a tilt shield 50. Die 48 is rectangular in cross-section, is tapered at its upper end as shown in FIG. 2, and includes a capillary 52 which extends down from the tapered upper end of the die and connects with the molten source material 44 in the crucible. A more specific description of the construction of the die is not believed necessary since EFG dies for growing silicon ribbon are well known, as exemplified by U.S. Patents Nos. 4,118,197 and 4,184,907. Die 48 is clamped between two D-shaped members 54 and 56 which are tapered so as to seat firmly in a tapered hole 58 in support ring 46.

Figure 3:
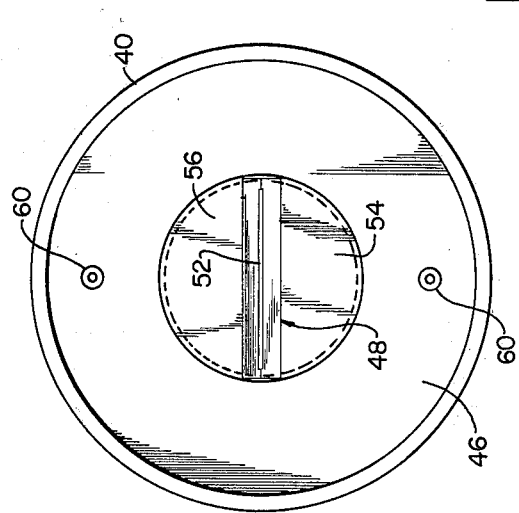
FIG. 3 is a plan view of the support base for the tiltable heat shield (THS)

Support ring 46 is provided with two diametrically opposed tapered holes 60 sized to receive the bottom ends of two like heat shield support pins 62. The fit between holes 60 and pins 62 is such as to allow the pins to rock about the axis of holes 60. The upper ends of pins 62 are reduced in diameter so as to form shoulders 64. These reduced diameter sections fit into two diametrically opposed holes 66 in tilt shield 50. Holes 66 are sized so as to make a close fit with the upper reduced diameter sections of pins 62 and so that the tilt shield rests on and is supported by shoulders 64. Hence, the shield is incapable of pivoting about the upper ends of the pins 62, but the pins are capable of pivoting relative to support ring 46. In this case because of the influence of control rod 34, the heat shield is capable of pivoting relative to support ring 34 about an axis perpendicular to the length and width of capillary die 48 and parallel to the thickness of the die (for the purpose of this description, the die length is the vertical dimension of the die as seen in FIG. 2, i.e., parallel to the direction of growth; the thickness dimension is the horizontal dimension of the die as seen in FIG. 2, and the width dimension is the horizontal dimension of the die as seen in FIG. 3).

Figure 4:
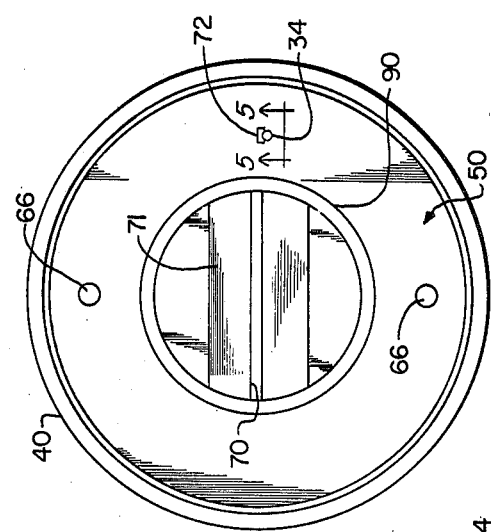
FIG. 4 is a plan view of the tiltable heat shield (THS) and the associated afterheater.

As seen in FIGS. 2 and 4, the shield 50 is formed with an elongate aperture 70 sized to accommodate the tapered upper end of die 48. Aperture 70 is sized so that the shield extends close enough to the die to maximize thermal transfer between it and the die, yet enough clearance is provided to permit tilting movement of the shield. Additionally, an angular depression 71 is formed in the upper side of shield 50 around aperture 70. Depression 71 reduces the amount of clearance required at aperture 70 to enable the operator to have a clear view of the meniscus.

Since the support pins 62 engage the shield along a diameter, pivotal movement of the shield can be achieved by applying a force to the shield at a point which does not lie along a diameter. In this case pivotal movement of the shield is accomplished by movement of operating rod 34.

Figure 5:
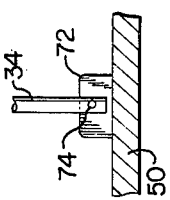
FIG. 5 is a sectional view taken along line 5—5 of FIG. 4.

The lower end of rod 34 is pivotally attached to shield 50. One way of making such attachment is to form shield 50 with a perforated tab or ear 72 on its upper side and to connect the latter to the rod by a pivot pin 74 (see FIGS. 4 and 5). The upper end of rod 34 is connected to an operating mechanism of suitable design. In this case the operating mechanism comprises an L-shaped crank arm 76 which is pivotally mounted between its ends to a yoke 78. Yoke 78 is attached to a bracket 80 which is secured to a frame 82 attached to the header 4. Yoke 78 supports a micrometer unit consisting of a housing 84 and a threaded shaft 86 screwed into the housing. The forward end of shaft 86 engages the lower end of crank 76. The other end of crank 76 is pivotally connected to the upper end of rod 34. A spring 88 connected between the lower portion of crank 76 and yoke 78 urges the crank in a clockwise direction, as viewed in FIG. 1. The position of the shaft 86 determines the rest position of crank 76 and thus the position of shield 50. When the threaded shaft 86 is screwed into its housing 84, it pivots the crank 76 counterclockwise (as seen in FIG. 1), thus pulling up rod 34 and thereby causing shield 50 to tilt so as to bring the side of the shield with tab 72 up and the other side down.

The apparatus also includes an afterheater 90 which may have various shapes. In this particular case it is generally cylindrical in cross-section. Afterheater 90 rests on and is supported by the upper surface of radiation shield 50. The afterheater is slotted at the bottom so as to form two diametrically opposed view ports or windows 92 for permitting visual inspection of the upper end of the die during a crystal growth operation. As seen in FIG. 4, the afterheater has an inside diameter large enough relative to the width of die 48 so as not to interfere with tilting movement of shield 50.

Completing the illustrated apparatus is a pulling mechanism represented generally at 94. Details of the pulling mechanism 94 are not illustrated since the pulling mechanism forms no part of the present invention and various forms of pulling mechanisms may be used. The pulling mechanism may but need not be mounted to and supported by frame 82.

For the growth of silicon ribbons it is advantageous and preferred that the crystal growing assembly 28, comprising crucible 38, susceptor 40, support ring 46, members 54 and 56, capillary die 48, tilt shield 50, and heat shield support pins 62 be made of graphite, while rod 34 and afterheater 90 may be made of molybdenum.

In growing a silicon ribbon with the illustrated apparatus, the afterheater 90 functions to remove thermal stresses in the grown crystalline body 32. The tilt shield 50 acts as a heat insulating member for the die top. The ends of the tilt shield act as a black body and aid in stabilizing the transfer of heat by radiation. This stabilization in turn helps maintain the top surface of the capillary die at a more uniform temperature. By tilting the heat shield small amounts, it is possible to compensate for imbalances in the thermal environment surrounding the upper end of the die due to uneven heating or cooling or other factors, and thus to adjust the temperature gradient along the width dimension of the meniscus which is formed between the upper end of the die and the growing crystalline body. Preferably the permissible tilting movement is sufficiently great to allow a portion of one half of the tilt shield to be moved above the upper end of the die. However, in practice the die tilt is usually relatively small, typically less than about 15°-20° from the horizontal. The adjustment afforded by the micrometer 84, 86 allows the shield to be tilted very precisely. Although not shown, it is to be appreciated that members 84 and 86 of the micrometer have cooperating markings graduated in mm. or thousands of an inch, as in a conventional micrometer, so as to enable the operator to ascertain and repeat selected angular portions for the tilt shield. Additionally the coaction of spring 88 and the micrometer shaft 86 on crank 76 assures that the tilt shield will remain in whatever position it is located once manual rotation of shaft 86 is terminated. On the other hand because the micrometer is located outside of the furnace, it is possible to modify the tilt angle of the shield during crystal growth by small precise amounts.

Obviously the invention is susceptible of modification. Thus, for example, the micrometer control for the control rod could be replaced by some other form of mechanism providing similar push-pull operation of the tilt shield. It is also possible for the tilt shield to be connected to the crank 76 by a flexible, heat resistant cable instead of a stiff control rod 34, with gravity tending to pivot the shield in a direction opposite to the force exerted by the cable. However, in that case, care must be taken for the flexible cable to be made of a material which will not introduce impurities to the furnace. Further possible modifications are to omit the afterheater or to separate it from the tilt shield, e.g., by supporting it from another member such as susceptor 40. The invention also may be applied to the growth of crystalline bodies of other cross-sectional shapes, e.g., bodies of elliptical cross-sections, in which case the central aperture in the tilt shield must be modified to conform to the general shape of the upper end of the particular die used for growing the differently shaped body.

Other modifications and advantages of the invention will be obvious to persons skilled in the art.

What is claimed is:

1. Apparatus for growing a crystalline ribbon-like body from a melt comprising:
    a furnace enclosure,
    a crucible disposed within the enclosure for containing a melt,
    means for applying heat to the melt in the crucible,
    a capillary die extending into the crucible and arranged for supplying melt to a meniscus formed between the die and a growing crystalline body,
    a heat shield plate surrounding the upper end of the capillary die, said plate extending transversely of the die,
    means supporting said heat shield plate for pivotal movement about a horizontal axis so that a portion of the heat shield plate may be raised or lowered relative to the upper end of the capillary die and the effect of movement of the heat shield plate on the thermal field surrounding the upper end of the die is greatest at the outer edge of said portion, and
    operating means for pivoting said heat shield plate, said operating means comprising actuating means disposed outside of said furnace enclosure.

2. Apparatus according to claim 1 wherein said axis is located near the upper end of said capillary die.

3. Apparatus according to claim 1 or 2 wherein said operating means comprises a rod connecting said heat shield plate to said actuating means.

4. Apparatus according to claim 3 wherein said actuating means comprises a micrometer mechanism.

5. Apparatus according to claim 4 wherein said heat shield plate is made of graphite.

6. Apparatus according to claim 1 wherein the upper end of said die has a rectangular edge configuration in cross-section, and said plate has an aperture through which the upper end of the die extends.

7. Apparatus according to claim 6 further including an angular depression in said plate surrounding said aperture.

8. Apparatus according to claim 1 further including a passive afterheater for said ribbon-like body mounted on and movable with said plate.

9. Apparatus according to claim 6 wherein said plate is circular.

10. Apparatus according to claim 3 wherein said rod extends vertically away from said heat shield plate and said actuating means is located above said heat shield plate.

11. Apparatus according to claim 10 wherein said heat shield plate is made of graphite and has an aperture through which said capillary die extends, and further including a passive afterheater made of graphite mounted on and movable with said heat shield.

12. Apparatus according to claim 3 for growing a ribbon-like body of silicon, wherein said heat shield plate is made of graphite and has an aperture through which said capillary die extends.

* * * * *

UNITED STATES PATENT AND TRADEMARK OFFICE
CERTIFICATE OF CORRECTION

PATENT NO. : 4390505

DATED : June 28, 1983

INVENTOR(S) : Aaron S. Taylor et al

It is certified that error appears in the above-identified patent and that said Letters Patent is hereby corrected as shown below:

Please add application claims 11 and 19 as claims 13 and 14 respectively, as petitioned by patentee.

Signed and Sealed this

Fourteenth Day of February 1984

[SEAL]

Attest:

GERALD J. MOSSINGHOFF

Attesting Officer

Commissioner of Patents and Trademarks